United States Patent [19]
Bedford et al.

[11] Patent Number: 5,969,664
[45] Date of Patent: Oct. 19, 1999

[54] METHOD FOR CHARACTERIZING AIR TRAFFIC CONTROL RADAR BEACON SYSTEM ANTENNA PATTERNS

[75] Inventors: Brent L. Bedford, Boulder; Julie E. Kub; Bradley J. Ramsey, both of Littleton; Teresa G. Sparkman; Robert B. Stafford, both of Boulder, all of Colo.

[73] Assignee: The United States of America as represented by the Secretary of Commerce, Washington, D.C.

[21] Appl. No.: 08/937,868

[22] Filed: Sep. 25, 1997

[51] Int. Cl.⁶ ................................................. G01S 13/91
[52] U.S. Cl. ............................................................... 342/37
[58] Field of Search .............................. 342/173, 37, 165, 342/36, 39

[56] References Cited

U.S. PATENT DOCUMENTS

| | | | |
|---|---|---|---|
| 5,012,251 | 4/1991 | Kennedy et al. | 342/176 |
| 5,014,065 | 5/1991 | Andrieu et al. | 342/165 |
| 5,130,716 | 7/1992 | Kleiber | 342/173 |
| 5,172,124 | 12/1992 | Becavin et al. | 342/360 |
| 5,262,787 | 11/1993 | Wilson et al. | 342/173 |
| 5,396,255 | 3/1995 | Durkota et al. | 342/173 |
| 5,689,266 | 11/1997 | Stelling et al. | 342/173 |

OTHER PUBLICATIONS

Honold, Peter "Secondary Radar", Siemens Aktiengesellschaft, Heyden; Berlin, Monchen, 1976, pp. 35–71.

Lynn, Paul A. "Radar Systems", Van Nostrand Reinhold, 1987, pp. 109–119.

Matheson, R.J. "RSMS Pulse Processing System", White paper written for the Federal Aviation Admin. Institute of Telecommunication Sciences, Dec. 8, 1995.

Stevens, Michael C. "Secondary Surveillance Radar", Artech House, Inc., Norwood, MA, 1988 pp. 252–257.

Dept. of Transportation, F.A.A., "Spectrum Management Regulations and Procedures Manual", Sep. 8, 1987, pp. 137–138, 183–187, 179–188.

Dept. of Transportation, F.A.A., ":U.S. National Aviation Standard forhte Mode Select Beacon System (Mode S)", Jan. 3, 1983, pp. 6, 7, 27.

*Primary Examiner*—Daniel T. Pihulic
*Attorney, Agent, or Firm*—Henderson & Sturm

[57] ABSTRACT

A method for measuring and characterizing the Air Traffic Control Radar Beacon System without interrupting service which comprises a computer-controller system which captures the beacon radar system emissions during one radar rotation and software which extracts and plots the two antenna signal patterns. Data is collected for 50 microseconds during each degree of antenna rotation, triggered by the first pulse of the three pulse signals, and is then stored in separate omni-directional and directional arrays for subsequent plotting. Data is also collected for 50 microseconds during each one-tenth degree of antenna rotation within the directional antenna main lobe.

18 Claims, 4 Drawing Sheets

METHOD FOR CHARACTERIZING AIR TRAFFIC CONTROL RADAR BEACON SYSTEM ANTENNA PATTERNS

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

This invention relates to the Air Traffic Control Radar Beacon System, and more particularly to a method for characterizing the system antenna patterns during actual use.

2. Description of the Related Art

In the United States, the Federal Aviation Administration uses a radio navigation system known as the Air Traffic Control Radar Beacon System (ATCRBS) to determine the range and azimuth of transponder-equipped aircraft. The ATCRBS consists of a ground-based interrogator-receiver that interrogates the aircraft transponder and is unique in its use of two separate radio emission patterns, known as antenna patterns, to improve the accuracy of the measured aircraft locations. The radar beacon system depends on a precise relationship between these two antenna patterns for satisfactory performance. The emissions for each pattern consists of a series of pulses which are transmitted at separate times but on the same radio frequency, thus precluding the use of conventional antenna pattern measurement techniques to characterize the two patterns.

One of the signals emitted by the ATCRBS system is roughly the same strength in all directions from the antenna and is therefore known as the omni-directional signal. The second signal emitted is a directional signal which is much stronger in one direction than any other. The direction of maximum strength is called the main lobe of the antenna, and the antenna is rotated either physically or electrically so that all azimuths are swept by this signal during a fixed period of time. Both the omni-directional and directional signals are emitted at the same frequency, 1030 MHz, but are pulsed so that they are separated in time. A standard sidelobe suppression system (SLS) emits an initial pulse from the directional antenna, followed by a pulse from the omni-directional antenna, and then one or more additional pulses from the directional antenna. A variation called the improved sidelobe suppression system (ISLS) differs in that it emits the first pulse from both antennas. This helps remove azimuth ambiguities caused by signal reflections.

Conventional receiving equipment is unable to separate the pulses emitted by the directional antenna from those emitted by the omni-directional antenna. In order to measure the antenna patterns of the two antennas using these systems, each of the signals must be measured separately with the other turned off, degrading air traffic control information. It is possible to use a pulse separating system connected to the receiver to measure both signals simultaneously, but this is bulky and expensive and is therefore seldom used. Disrupting the service of the ATCRBS system or using expensive specialized equipment are currently the only methods available for making these measurements.

BRIEF SUMMARY OF THE INVENTION

A method for measuring and characterizing the Air Traffic Control Radar Beacon System without interrupting service. The invention comprises a computer-controller system which captures the beacon radar system emissions during one radar rotation and software which extracts and plots the two antenna signal patterns. Data is collected for 50 microseconds during each degree of antenna rotation, triggered by the first pulse of the three pulse signals, and is then stored in separate omni-directional and directional arrays for subsequent plotting. Data is also collected for 50 microseconds during each one-tenth degree of antenna rotation within the directional antenna main lobe.

BRIEF DESCRIPTION OF THE SEVERAL VIEWS OF THE DRAWINGS

Other objects, advantages, and novel features of the present invention will become apparent from the following detailed description of the invention when considered in conjunction with the accompanying drawings, wherein.

DETAILED DESCRIPTION OF THE INVENTION

Figure 1:
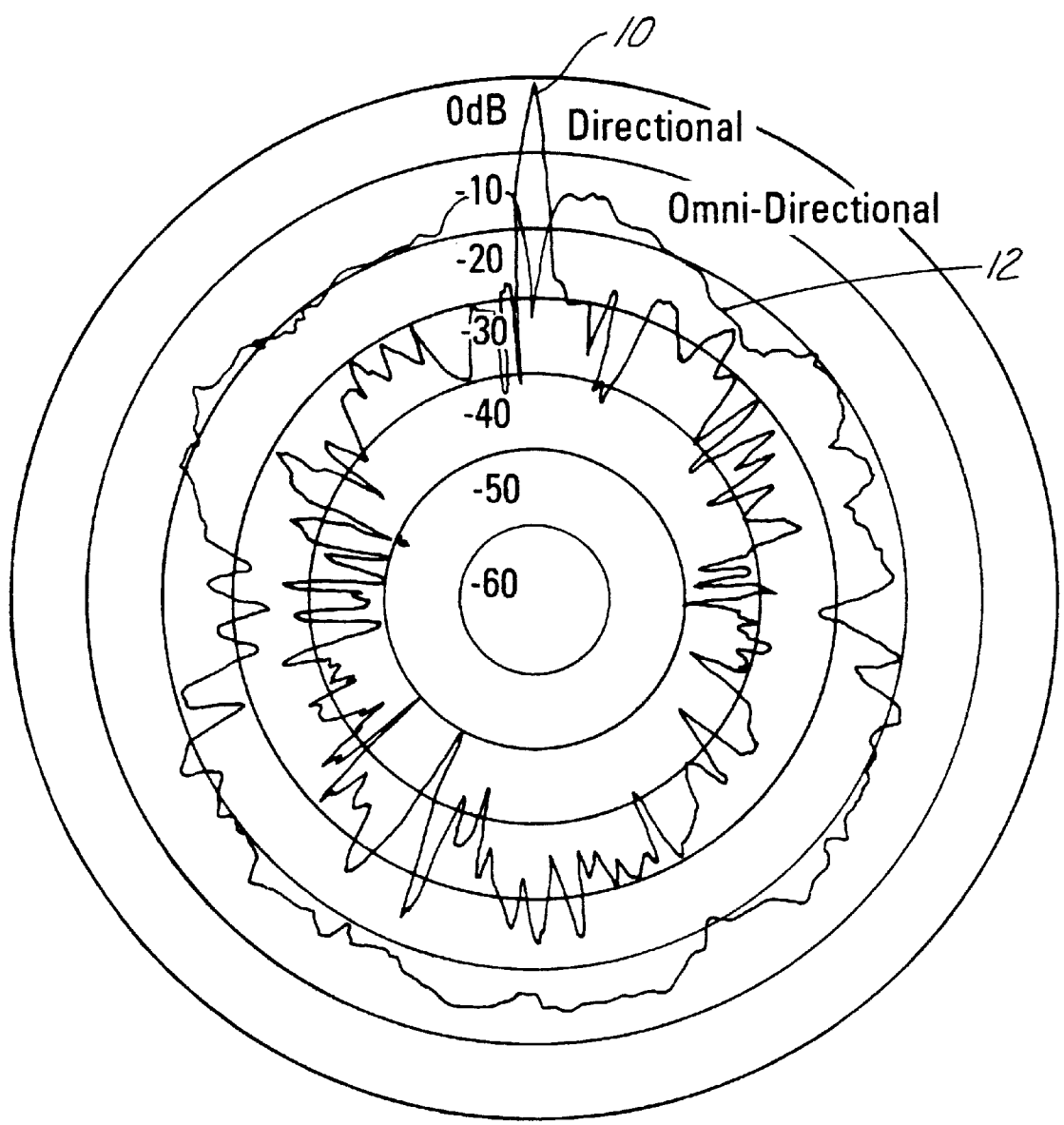
FIG. 1 depicts an omni-directional and a directional antenna pattern for an ATCRBS radar prepared in accordance with the present invention.

Non-disruptive measurement of the ATCRBS antenna patterns requires the use of pulse sorting techniques to discriminate between the signals generated by the directional and the omni-directional antennas. As the beacon radar antenna rotates, both omni-directional and directional signals are transmitted. The key to the present invention lies in capturing a collection of frames at specified intervals that contain representations of both of these signals. A computer is then used to find the peak omni-directional and directional values for each frame. FIG. 1 depicts an example of the resulting beacon radar antenna pattern. The polar-plotted graph shows the circular omni-directional data points 12 and directional data points 10. The data points in FIG. 1 are approximately one degree apart (360 points for one circular radar antenna rotation).

Figure 2:
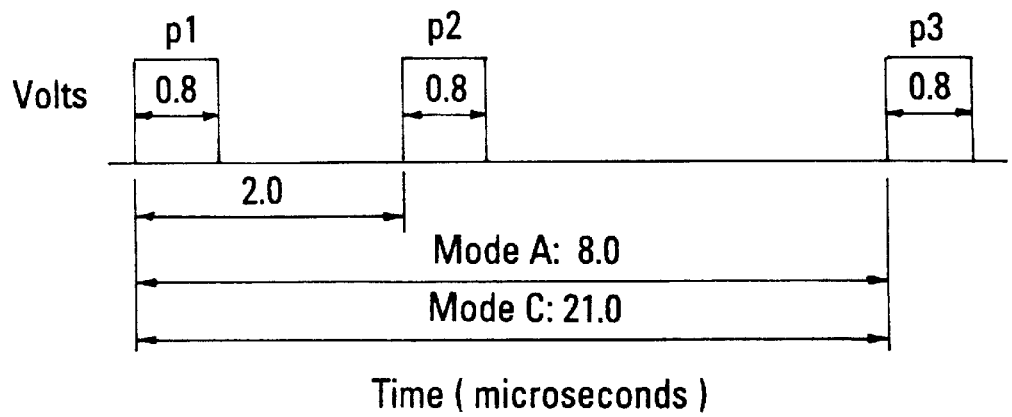
FIG. 2 graphically depicts the pulse widths and time between pulses for the two radar modes, Mode A and Mode C, used by the ATCRBS radar.

The beacon radar emits several different types of signals, most commonly Mode A and Mode C signals. Mode A is used when requesting aircraft identity, while Mode C is used when requesting aircraft altitude. The beacon radar emits pulses in groups of three for both Modes A and C. The first pulse is a directional pulse for SLS radar systems, or a combined directional and omni-directional pulse for ISLS systems. The second radar pulse is the omni-directional pulse, and the third pulse is the directional pulse. FIG. 2 shows the pulse widths and times between pulses for both Mode A and Mode C. Each mode contains three pulses: P1, P2, and P3. As can be seen from FIG. 2, Mode A requires 8.8 microseconds while Mode C requires 21.8 microseconds. The smallest selection of digitizing time which is larger than the Mode C time of 21.8 microseconds is 50 microseconds and is used in this embodiment.

The beacon radar antenna pattern acquisition is an automated process. The software initializes the measurement instruments, collects data, processes the data, graphs the resulting omni-directional and directional antenna patterns, and calculates the angular width of the main lobe half-power points.

Figure 3:
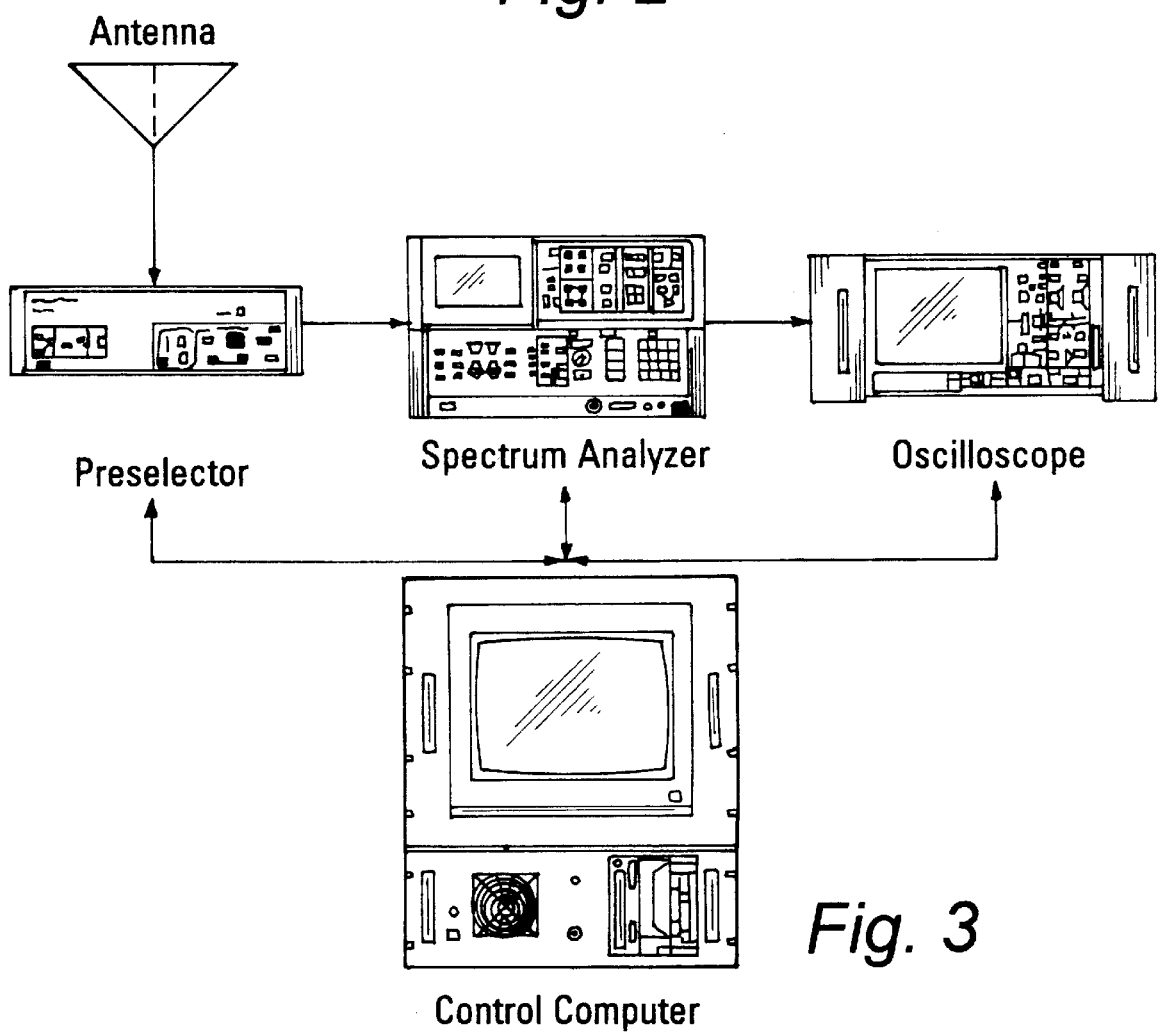
FIG. 3 depicts a hardware configuration used in one embodiment of the invention.

The first step in obtaining the antenna patterns is to connect and configure the instruments as depicted in FIG. 3. The instruments required are a directional antenna, a preselector, a spectrum analyzer, an oscilloscope, and a control computer. The instrument used to collect the frames of data must contain sufficient memory to store the data for a complete rotation of the radar antenna. The instrument's capabilities include the ability to define a trigger level and a hold value time. An oscilloscope is used in this invention to meet these requirements. The oscilloscope uses one of the emission signals to trigger the collection of each frame of data. The hold value time limits the amount of data saved and insures that the correct signals are contained within each frame. The antenna is placed on top of a measurement vehicle and pointed directly at the ATCRBS radar approximately 200 yards away. A radio frequency (RF) coaxial cable connects the antenna to the RF input of the preselector. The output of the preselector is connected to the input of the spectrum analyzer. The video output of the spectrum analyzer is connected to the channel 1 input of the oscilloscope. The preselector, spectrum analyzer and oscilloscope are all controlled by the computer using the General Purpose Interface Bus (GPIB) control. Software sends the GPIB commands to the instruments and performs all algorithm computations.

Figure 4:
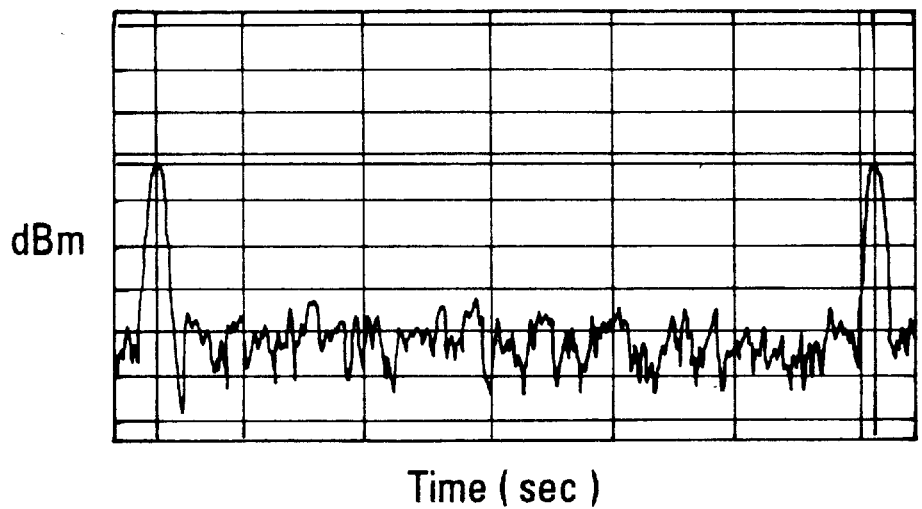
FIG. 4 depicts data collected by the spectrum analyzer and used to calculate the rotation time of the radar antenna.

Once the instruments are physically connected, the parameters are set via the GPIB. All instruments require parameter settings except the antenna. The spectrum analyzer requires the following parameters: center frequency= 1030 MHz; span=0 Hz; detection=positive peak; resolution bandwidth and video bandwidth=3 MHz; single sweep mode; sweep time=2.1 * radar antenna rotation time period; reference level=−10 dBm; and attenuation=0. The attenuation is adjusted until it allows for the largest possible signal to be displayed without exceeding the top of the spectrum analyzer screen. Once these parameter are set, a sweep is taken from the spectrum analyzer and the radar antenna rotation period in seconds is calculated. FIG. 4 shows an example trace from the spectrum analyzer with the markers set on the peak signals. The time between markers is the radar antenna rotation time period.

The following oscilloscope settings are constant for all beacon radar antenna patterns, while other parameters must be calculated on site: turn on only channel 1; DC trigger coupling; DC 1 MegOhm channel coupling; and 360 frames. The time per division, the number of samples per frame, the trigger hold value between frames, the trigger level, vertical offset, and volts per division require further discussion.

The oscilloscope sample rate setting is determined by the desired accuracy of the pulse amplitude and the need to keep the quantity of collected data within the capacity of standard test equipment. To determine the peak pulse amplitude, it is desirable to have multiple samples across each pulse for statistical reasons. Eight samples were chosen due to the oscilloscope settings. From FIG. 2, the pulse width for Mode A and Mode C is 0.8 microseconds, therefore the sample period is 0.1 microseconds. Since the digitizing time selected is 50 microseconds per frame, the number of samples per frame is 500.

Figure 5:
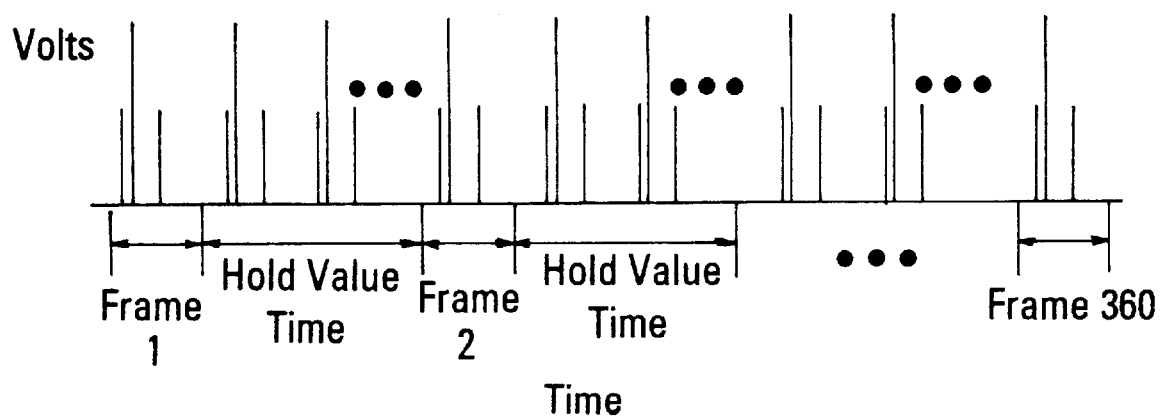
FIG. 5 graphically depicts the frame times and the frame hold value times during which no data is collected.

The trigger hold value time allows the acquisition of only 360 frames of data for one circular rotation of the radar antenna. As seen in FIG. 5, the hold value time is the waiting period until the next frame of 50 microseconds of data is collected. During the time between frames, pulsed radar emissions occur but the data is not recorded. To obtain the correct hold value time, the software divides the radar antenna rotation period in seconds per revolution, obtained during the preliminary spectrum analyzer sweep, by 360. This time minus 50 microseconds is the hold value time.

The software sets the trigger level to the smallest value that does not cause triggering on the noise spikes. This is performed by taking a sweep of the system noise and a sweep of the radar signal on the spectrum analyzer. The trigger level with the largest signal and smallest noise is chosen.

Figure 6:
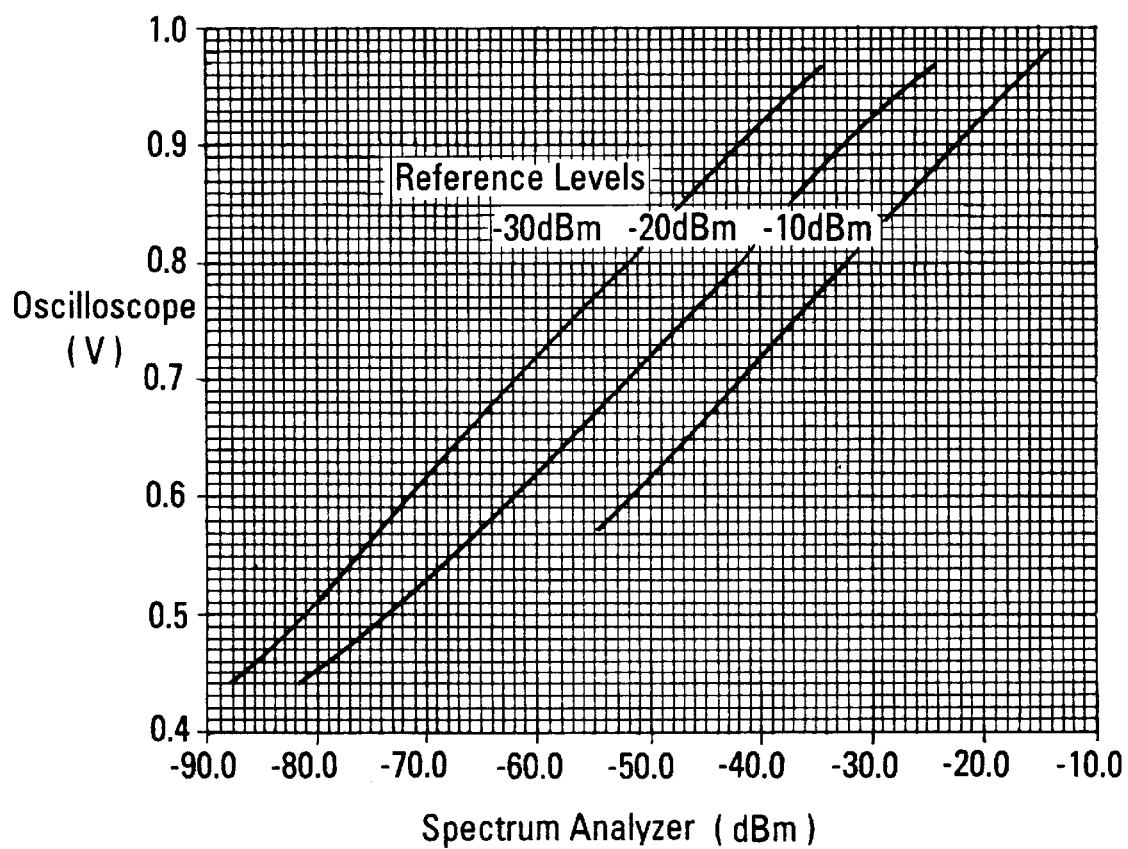
FIG. 6 graphically depicts the relationship between received power (dBm) and voltage.

The volts per division parameter is calculated by converting the maximum radar signal (dBm) and smallest system noise signal (dBm) on the spectrum analyzer to the corresponding volts value on the oscilloscope. This is done using the conversion tables shown in FIG. 6, then subtracting the two values and dividing the result by 8 divisions and rounding up to the next division multiple. The software sets the volts per division to display the highest amplitude level of pulses observed during one radar antenna rotation at or near full screen. This provides maximum dynamic range and amplitude resolution. The vertical offset is determined by adding the two voltge values and dividing by 2 so that the signal is vertically displayed in the center of the screen.

Once the instrument parameters are set, the software initiates the data acquisition. The software acquires one 50 microsecond data frame consisting of three pulses from the two antennas for every degree of the radar antenna rotation. A software command instructs the oscilloscope to acquire a sequence of 360 data frames (one per degree of the radar antenna rotation). Next, the software retrieves the 360 frames of data from the oscilloscope into the computer for processing.

Typically, one would take a single oscilloscope trace, store it, retrieve it, and process it. However, the computer cannot download the data via GPIB from the oscilloscope in the short time between successive data frames, thus the oscilloscope needs to have enough memory to store data for one full radar antenna rotation. A feature called segmented memory enables all of this data to be saved in the oscilloscope. Segmented memory is used by dividing the oscilloscope's memory into 360 frames, with 500 samples per frame. Therefore the oscilloscope stores 180,000 samples of data before the computer downloads it for processing.

For each of the 360 frames, the software finds the usable Mode A and Mode C frames. A frame is identified as Mode A or Mode C if a usable number of pulses are in the frame and the time between pulses is correct. To ensure a usable Mode A or Mode C frame, each frame must contain exactly three peaks, as shown in FIG. 5. The software uses the trigger level to check for a usable number of pulses. The software also uses the time between P1, P2, and P3 to check validity. As shown in FIG. 2, the time between P1 and P2 should be 2 microseconds, with a specified radar tolerance of±0.35 microseconds [(radar error)±2 * time per point (oscilloscope digitization error)]. The time between P1 and P3 should be 8 microseconds for Mode A and 21 microseconds for Mode C, with a specified radar tolerance of±0.40 microseconds [(radar error±2 * time per point (oscilloscope digitization error)]. From each usable frame, the software stores the maximum omni-directional peaks in one array and the maximum directional peaks in another array. The software uses the second pulse P2 for the omni-directional peaks and the third pulse P3 for the directional peaks, recalling that the first peak may be directional or omni-directional and directional depending on the side lobe suppression mode in use. If a frame is not a usable Mode A or Mode C, the frame is flagged as unusable.

Once the data is acquired, the software converts it to a usable form and graphs it on a polar plot as shown in FIG. 1. The software rotates the omni-directional and directional data arrays so that the maximum main lobe datum is the first point. Using conversion tables, illustrated in FIG. 6, the software converts the data from voltage values measured by the oscilloscope to dBm as received by the spectrum analyzer. The conversion tables are generated separately, prior to the radar measurement. Then the software normalizes the data by subtracting the maximum main lobe datum from all other values, so that the maximum is now 0 dB and other points are negative, as is standard in radar antenna graphing. Finally, the software plots the normalized data in dB on a polar plot with the main lobe at the center top of the graph.

If necessary, the software repeats the last three steps to obtain data for frames that did not contain usable Mode A or Mode C pulses and were flagged as unusable. The new frame values must be inserted into the data arrays each time usable data is obtained. In general, after multiple attempts at data acquisition, the software has 360 usable frames for analysis. However, sometimes the unusable frames cannot be captured due to a different mode transmission or a noisy RF environment. In such a case, the execution of the algorithm will stop after a limiting maximum number of repetitions, 5 for example.

The main lobe portion of the antenna pattern requires one data point every tenth of a degree for better resolution in order to calculate an accurate 3 dB beamwidth. Therefore the software repeats the data collection and graphing steps at one tenth of a degree resolution. The previous discussion for one degree between data points applies to the one tenth of a degree between data points except for a few setting changes on the oscilloscope.

First, the trigger level is set so that only data frames in the main lobe are acquired. This trigger level is greater than the maximum omni-directional value for the data already collected. Since the omni-directional graph is ideally uniformly circular and greater in value than all of the directional data other than the main lobe, setting the trigger level above the maximum omni-directional value allows the oscilloscope to collect a majority of the main lobe data points.

Next the hold value time is decreased to obtain one tenth of a degree between data points. To calculate this hold value time, divide the rotation period by 3600. The number of samples collected can remain at 360 since the number of data points collected is unknown, but less than 360. The data collection is stopped when one rotation of data has been collected.

The final step of the antenna pattern algorithm is finding the angular distance between points on the antenna pattern that are 3 dB down from the maximum value of the main lobe. For more accuracy, the software uses the data with one tenth of a degree between data points. The software locates the first datum which is less than −3 dB after the main lobe peak and the last datum which is less than −3 dB before the main lobe peak. The software calculates the difference between the degree values which are represented by these data.

Although only an exemplary embodiment of the invention has been described in detail above, those skilled in the art will readily appreciate that many modifications are possible without materially departing from the novel teachings and advantages of this invention. For example: the data could be acquired in various degree resolutions other than the one degree and one-tenth degree resolutions disclosed; a greater or fewer number of samples per frame could be used; other radar modes besides A and C could be identified; a wide-bandwidth receiver (greater than 1.25 Mhz) could be substituted for the spectrum analyzer. Accordingly, all such modifications are intended to be included within the scope of this invention as defined in the following claims.

What is claimed is:

1. A method for simultaneously and separately measuring air traffic control radar beacon system (ATCRBS) interrogator omnidirectional and directional azimuthal antenna patterns, comprising the steps of:

(a) receiving radar signals transmitted by the ATCRBS interrogator;

(b) collecting signal data received from said ATCRBS interrogator;

(c) distinguishing valid signal data modes collected from said ATCRBS interrogator from noise;

(d) separating said valid signal data modes into omnidirectional and directional components;

(e) storing said omnidirectional data components in a first array;

(f) storing said directional data components in a second array; and (g) plotting said omnidirectional data components and said directional data components as separate omnidirectional and directional azimuthal antenna patterns.

2. The method of claim 1 wherein said plotting of said omnidirectional data components and said directional data components as separate omnidirectional and directional azimuthal antenna patterns is simultaneous on one graphical display.

3. The method of claim 1 wherein said signal collecting step b of claim 1 further comprises the steps of:

selecting a trigger level to discriminate the collected ATCRBS interrogator signal from said noise;

choosing a sampling rate for adequate data resolution;

selecting a trigger hold-value time period for collection of said ATCRBS interrogator signal data at a predetermined angular resolution;

acquiring signal data for one interrogation of said ATCRBS interrogator, said one interrogation being a data frame; and collecting sequential data frames, separated by said trigger hold-value time period, through one complete rotation of said ATCRBS interrogator.

4. The method of claim 3 wherein said distinguishing step c of claim 1 further comprises the steps of:

identifying a threshold level for determining valid interrogator signal modes collected from said ATCRBS interrogator;

determining peaks above said threshold level, said peaks separated by a time interval;

validating said collected sequential data frames based on the number of said peaks; and validating said collected sequential data frames based on said time interval between peaks.

5. The method of claim 4 wherein said separating step d of claim 1 further comprises the steps of:

selecting omnidirectional and directional data segments from said valid interrogator signal modes; and determining peaks of said omnidirectional and directional data segments.

6. The method of claim 5 wherein said step plotting step g of claim 1 further comprises the steps of:

normalizing said omnidirectional and directional peaks so that a maximum main lobe directional peak is set to 0 dB;

converting said normalized peaks to polar coordinates; and rotating said converted peaks in azimuth so that said maximum main lobe directional peak is set to 0 degrees.

7. The method of claim 6 wherein said collected omnidirectional and directional peaks received from said ATCRBS interrogator are combined with previous collections to further complete the omnidirectional and directional ATCRBS interrogator antenna patterns.

8. The method of claim 7 wherein said trigger hold-value time and said trigger level are modified to acquire further detail in said main lobe of the directional antenna pattern.

9. A signal receiving and data processing system for characterizing air traffic control radar beacon system (ATCRBS) interrogator omnidirectional and directional azimuthal antenna patterns, comprising:

(a) a radio frequency receiving system for receiving signals from the ATCRBS interrogator;

(b) an analog signal digitization device; and (c) a data processing and storage device.

10. The signal receiving and data processing system of claim 9 wherein said radio frequency receiving system comprises:

a directional antenna;

a preselector; and an amplitude detector.

11. The signal receiving and data processing system of claim 10 wherein said amplitude detector is a spectrum analyzer.

12. The signal receiving and data processing system of claim 11 wherein said analog signal digitization device is an oscilloscope.

13. The signal receiving and data processing system of claim 12 wherein said oscilloscope contains sufficient memory to store radar signal data for one complete rotation of the ATCRBS antenna.

14. The signal receiving and data processing system of claim 13 wherein said oscilloscope further includes the ability to define a trigger level, a sampling rate, and a trigger hold-value time.

15. The signal receiving and data processing system of claim 14 wherein said data processing and storage device is a computer.

16. A signal receiving and data processing system for characterizing air traffic control radar beacon system (ATCRBS) interrogator omnidirectional and directional azimuthal antenna patterns, comprising:

(a) a directional antenna for receiving signals from said ATCRBS interrogator;

(b) a preselector;

(c) a spectrum analyzer;

(d) an oscilloscope; and (e) a control computer with software.

17. The signal receiving and data processing system of claim 16 wherein said oscilloscope contains sufficient memory to store radar signal data for one complete rotation of said ATCRBS antenna.

18. The signal receiving and data processing system of claim 17 wherein said oscilloscope further includes the ability to define a trigger level, a sampling rate, and a trigger hold-value time.

* * * * *